United States Patent [19]

Braun

[11] Patent Number: 4,609,983
[45] Date of Patent: Sep. 2, 1986

[54] APPARATUS FOR DETERMINING ACTIVE AND/OR REACTIVE CURRENT AND/OR THE POWER THEREOF IN AN INVERTER WITH A GIVEN INPUT D-C VOLTAGE, ESPECIALLY IN A PULSED INVERTER

[75] Inventor: Michael Braun, Erlangen, Fed. Rep. of Germany

[73] Assignee: Siemens Aktiengesellschaft, Berlin and Munich, Fed. Rep. of Germany

[21] Appl. No.: 729,978

[22] Filed: May 2, 1985

[30] Foreign Application Priority Data

May 4, 1984 [DE] Fed. Rep. of Germany ....... 3416520
Jul. 9, 1984 [DE] Fed. Rep. of Germany ....... 3425240

[51] Int. Cl.⁴ ............................................. H02P 13/20
[52] U.S. Cl. ........................................ 363/98; 363/35; 363/132; 323/207
[58] Field of Search .............................. 363/79–80, 363/35, 37, 51, 97–98, 131, 132; 323/207, 910

[56] References Cited

U.S. PATENT DOCUMENTS 3,967,173  6/1976  Stich ............................... 363/132 X
4,099,225  7/1978  Nygaard .......................... 363/98 X
4,307,442  12/1981 Yano et al. ....................... 323/207 X
4,502,106  2/1985  Glennon .......................... 363/132 X
4,546,422  10/1985 Okado ............................. 363/98 X

FOREIGN PATENT DOCUMENTS 0025370  3/1981  Japan .................................. 323/910

Primary Examiner—Peter S. Wong
Attorney, Agent, or Firm—Kenyon & Kenyon

[57] ABSTRACT

In an inverter, the phase, frequency and amplitude of the output voltage are determined by the switching signals for the inverter switches. By means of the switches which can be actuated by the same switching signals, the measured values corresponding to the phase currents are pulse width-modulated. The instantaneous values of the phase power formed thereby are optionally added to form the total active power sum. A characteristic stage can weight the sum signal with the reciprocal value of the voltage drive of the inverter, so that a signal is produced which is proportional to the active current. In a similar manner, also the reactive current can be determined by means of switches if the phase of the measured phase currents is shifted by $\pi/2$.

9 Claims, 6 Drawing Figures 4,609,983

APPARATUS FOR DETERMINING ACTIVE AND/OR REACTIVE CURRENT AND/OR THE POWER THEREOF IN AN INVERTER WITH A GIVEN INPUT D-C VOLTAGE, ESPECIALLY IN A PULSED INVERTER

BACKGROUND OF THE INVENTION

The present invention relates to apparatus for determining the instantaneous power in a phase of an inverter with a given input d-c voltage, especially in a pulsed inverter, as well as to its further development for determining the active and/or reactive power, the active and/or reactive current in this phase or for determining these quantities for the entire inverter.

Frequently, the measured value of the active or reactive current is used for damping, for instance, current and speed oscillations of inverter-fed asynchronous machines, where, a determination of the applicable measurement value with as little delay as possible is desirable.

One possibility is, for instance, to recalculate the output voltage into two-phase components and then to smooth and normalize them by means of a vector filter. The normalized output voltage is then multiplied by the corresponding two-phase components of the active and reactive current, respectively, or, if the unnormalized output voltage is used, the measured values of the active or reactive power. This requires not only appropriate computing stages for recalculation into two-phase components, but also the vector filter itself. If such measured values are required individually for the phases of the inverter, they must be calculated from the two-phase components.

SUMMARY OF THE INVENTION

It is an object of the present invention to determine, with a minimum of technical means, these measurement values of such an inverter, especially of the converter on the load side, of an intermediate-link inverter with impressed intermediate-link voltage.

The above and other objects are achieved by an apparatus for determining the instantaneous power of at least one phase of a load connected inverter having at least one switch coupled to the phase, particularly a pulsed inverter, comprising switch means and means for providing a measurement signal corresponding to the phase current of the inverter to the switch means, the switch means being actuated by a switching signal, which determines the switching state of the at least one switch of the inverter coupled to the phase, a signal corresponding to the instantaneous power of the phase being generated at the output of the switch means.

Accordingly, the starting point is a circuit, in which a measuring signal corresponding to an individual phase current is applied to a switch which is actuated by the switching signal determining the switching state of the inverter switch operating on this phase. The output signal of the switch indicates the instantaneous value of the phase power or, after averaging over a half-period of the current, the active power of the phase.

A measuring signal corresponding to the phase current at one output of the inverter can be applied directly when the active power is determined or, after a phase shift by $\pi/2$ when the rective power is being determined, to respective switches. The switches are actuated by the signals determining the switching state of the inverter switches. The output signals of the switches are then added in a superposition stage which furnishes the corresponding pulse width modulated measured value of the active or the reactive power, respectively.

BRIEF DESCRIPTION OF THE DRAWINGS

The invention will be explained in greater detail in the following detailed description with reference to the drawings in which.

DETAILED DESCRIPTION

Figure 1:
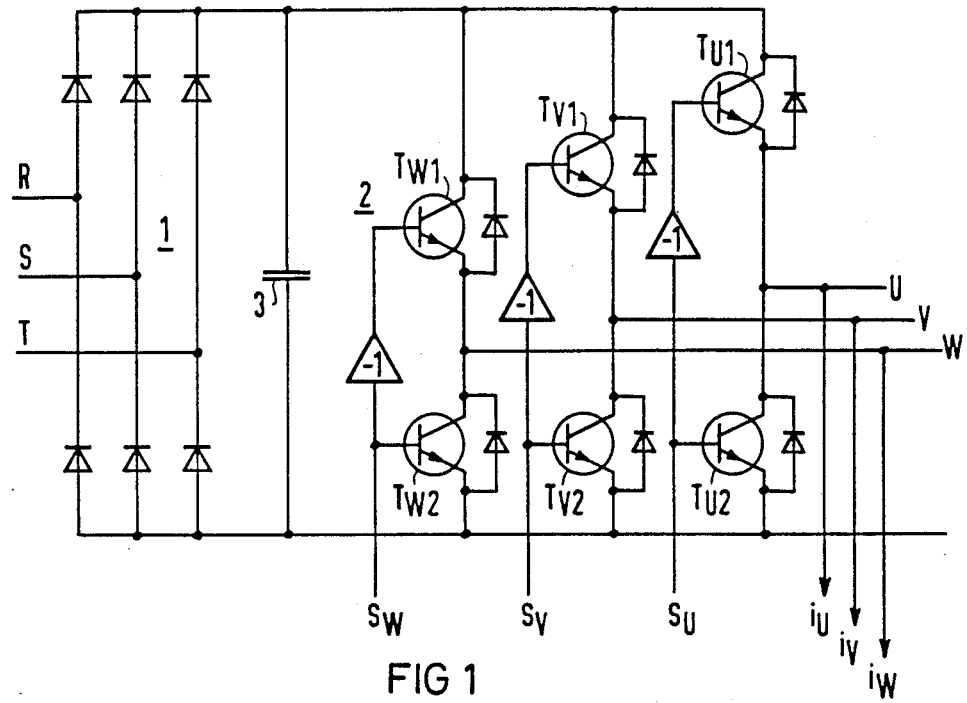
FIG. 1 is a diagram of an intermediate-link converter with impressed intermediate-link voltage comprising a rectifier, intermediate link and load side converter.

With reference now to the drawings, FIG. 1 shows an intermediate-link converter comprising uncontrolled rectifier 1, intermediate link and load-side d-c to a-c converter 2. R, S and T shown in FIG. 1 designate the terminals, connected via the rectifier circuit 1 to a practically constant a-c network, and U, V and W designate the outputs of the load side converter 2. Via suitable measuring stages, measured values $i_U$, $i_V$ and $i_W$ for the phase currents at the outputs U, V and W are formed.

In the converter 2 on the load side, each output U, V and W is alternatingly connected via a semiconductor switch (for instance, transistors) $T_{U1}$, $T_{U2}$, $T_{V1}$, $T_{V2}$, $T_{W1}$, $T_{W2}$ to the positive or negative pole of the intermediate link, of which the intermediate-link voltage furnished by the rectifier bridge 1 is kept constant via a capacitor 3. The driving signals for the three semiconductor switches are designated with $S_U$, $S_V$, $S_W$. In each switch, the individual transistors are shunted by antiparallel connected recovery diodes. Further details known to those skilled in the art (driver stages, means for potential separation etc.) are omitted in FIG. 1.

The phase of the output voltages of the rectifier 2 is determined by the switching pulses. The use of transistor switches makes it possible, in particular, to synthesize a pulse width-modulated and in particular, sinusoidal output voltage by high-frequency switching between the two intermediate-link poles. By impressing the output voltages in this way, the output currents are determined by the impedance conditions of the respective load and adjust themselves freely. The instantaneous power is then obtained by multiplication with the correct phase, of the respective output current by the impressed voltage, of which the mean value, formed by suitable smoothing, indicates in each halfperiod of the voltage the applicable active power of the phase, while the respective reactive power of a phase can be obtained from the product of the phase current and the voltage shifted 90°.

Figure 2:
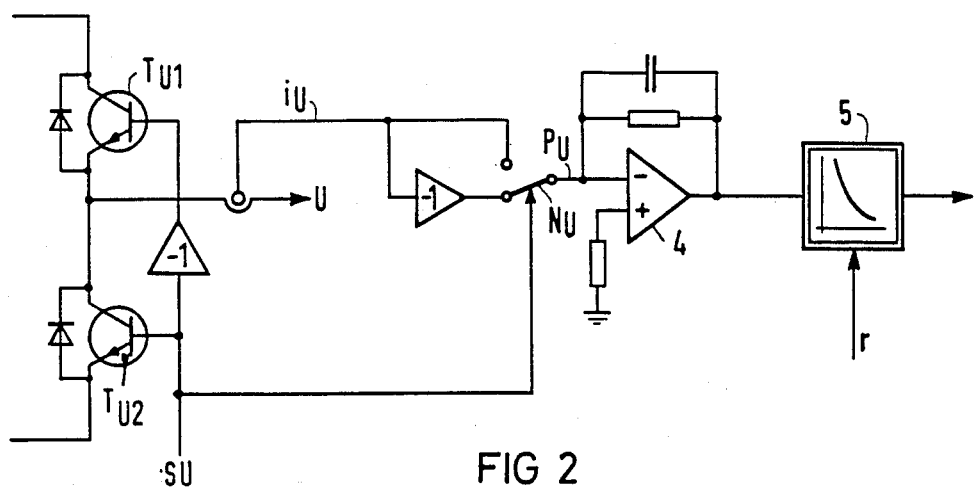
FIG. 2 is a block diagram illustrating the invention for the case wherein the instantaneous power, the active power and the active current are to be determined for an individual phase.

In FIG. 2, the switching signal $S_U$ which actuates the inverter switches $T_{U1}$ and $T_{U2}$ operating on the phase U, is also used for switching a switch $N_U$ designed as a double-throw polarity switch, and the measurement signal corresponding to the phase current $i_U$ is fed to the switch $N_U$ both in noninverted and inverted form. Taking these polarity changes into consideration, the switching signal $S_U$ represents the phase voltage which is pulse width-modulated and is normalized to the intermediate link voltage, and the switch serves as a pulse width multiplier for the voltage and the current.

If the input d-c voltage (intermediate-link voltage) and the amplitude of the output fundamental of the inverter are known, then this pulsed switch output signal is a direct measure for the instantaneous power at this phase, and the mean value measured in each half-period indicates the active power. The operationsl amplifier 4 wired as a smoothing stage serves in the formation of this mean value.

For taking the voltage amplitude into consideration, the characteristic stage 5 is provided, which is connected thereto and weights the switch output signal with the reciprocal value of the inverter drive (possibly with further consideration of the voltage normalization to the intermediate link voltage). Thereby, a signal for the active current of this phase is then generated.

If this circuit is applied to all phases of the inverter, a corresponding measurement signal for the instantaneous active power and the active current of the entire inverter can be formed by addition of the powers or the currents.

Figure 3:
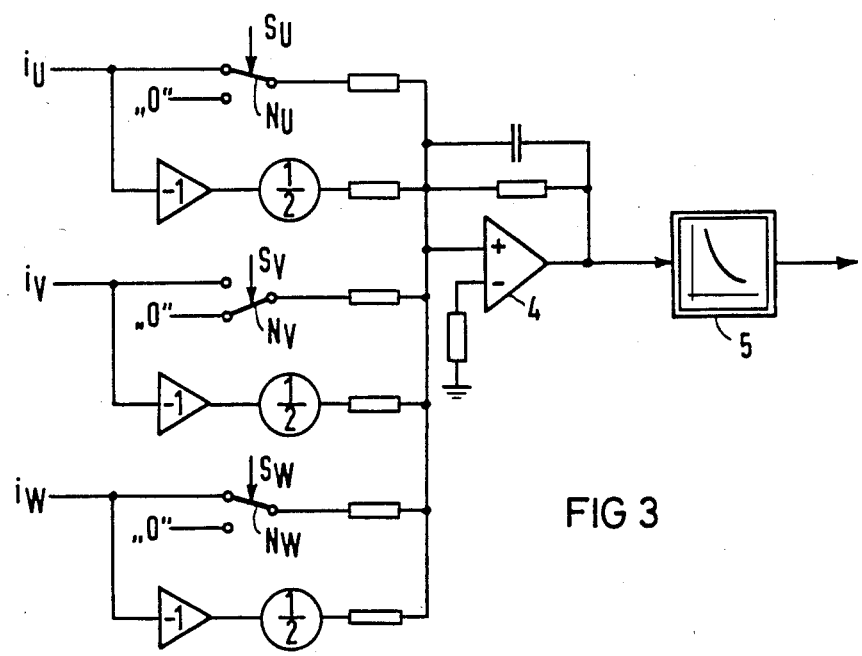
FIG. 3 is a circuit diagram showing how the active power and active current of the entire converter according to FIG. 1 can be determined.

A circuit for accomplishing this is shown in FIG. 3, where a design of the switches $N_U$, $N_V$ and $N_W$ for the measurement signals of the currents $i_U$, $i_V$ and $i_W$ is chosen, in which the switches themselves are designed as simple on/off switches and the change of polarity is achieved by the provision that the respective measurement signals are fed weighted by the constant factor $-\frac{1}{2}$ to the adding stage as the inverted switch output signals. The already mentioned operational amplifier 4 which is wired as a smoothing stage if again used as the adding stage.

Figure 4:
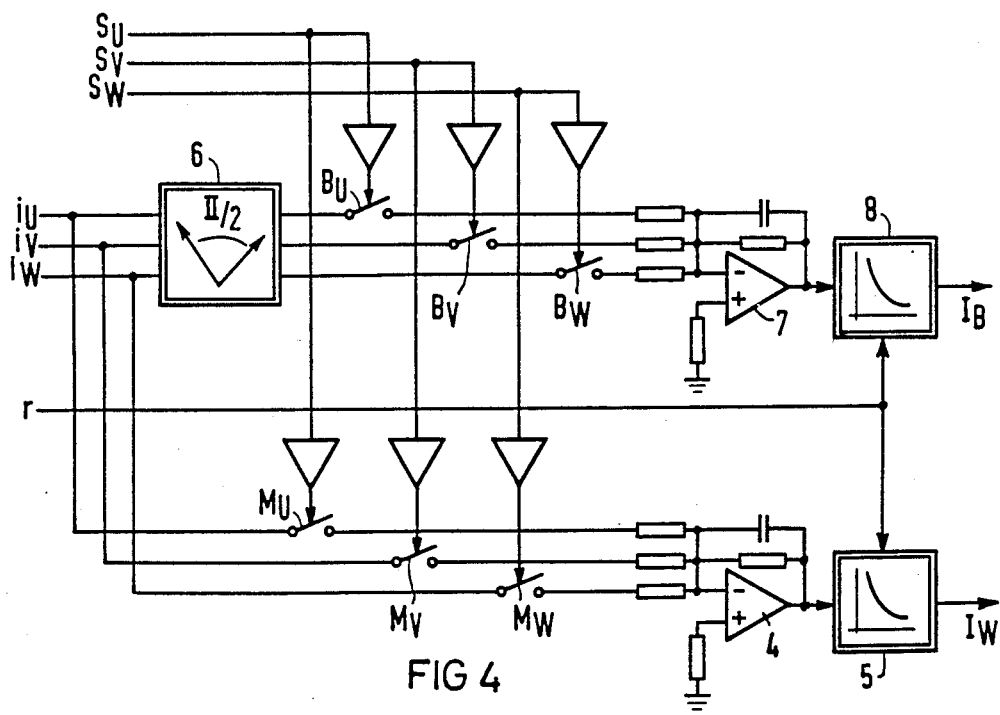
FIG. 4 shows a circuit diagram for apparatus for simultaneously determining the active current and the reactive current of the converter of FIG. 1.

If the Y-point of the converter on the load side is not connected, one has $i_U + i_V + i_W = 0$ and the measurement signals weighted with the factor $-\frac{1}{2}$ need not be taken into consideration. Thus, one arrives at a simplified circuit such as is shown in FIG. 4.

There, the respective measurement values $i_U$, $i_V$ and $i_W$ are fed, for determining the active power, to respective switches $M_U$, $M_V$ and $M_W$, where each switch is actuated by the respective switching signals $S_U$, $S_V$ and $S_W$ of the inverter switch assigned to the corresponding phase U, V, W. At the outputs of these switches are now present output signals which represent pulse width-modulated values for the active and reactive power of this output. The corresponding measurement values for the entire inverter are formed by adding the active phase currents to form the resulting active-current measurement value directly in the addition stage 4.

The measurement value formed thereby has, due to the pulse width multiplication, fundamentals which, however, can be eliminated by smoothing. The higher the frequency of the pulse width modulation, the easier it is to perform the smoothing operation. Especially in a pulsed inverter, a small amount of smoothing is therefore sufficient, which is provided by the R-C wiring of the operational amplifier 4 (addition stage).

The pulse-width ratio (duty cycle) of the switching signals of the pulsed inverter also fixes the amplitude of the output voltage fundamental, however, so that the output signal of the adding stage is proportional to the active power via the degree of drive of the inverter. Therefore, the adding stage is followed by the characteristic stage 5 for determining the active current, whereby the measured value supplied by the adding stage is weighted with the reciprocal value of the inverter drive. The corresponding output signal, which is now independent of the degree of drive of the inverter, of the characteristic stage 5 can, of course, be generated also in different ways; in particular, it is possible to carry out this weighting with the reciprocal value of the degree of drive digitally in the control of the machine processing, for instance, by a microprocessor. Corresponding digital building blocks can also be used instead of the analog switches $M_U$, $M_V$ and $M_W$ instead of the adding member 4.

One can proceed in a similar manner for determining the reactive current, it being merely necessary to shift the phase 90° by means of a phase shifter 6 as to the measurement signals $i_U$, $i_V$ and $i_W$. The measured values phase-shifted in this manner are fed to corresponding switches $B_U$, $B_V$ and $B_W$, which are likewise actuated by the switch signals $S_U$, $S_V$ and $S_W$ determining the switching state of the inverter switches. A subsequent adding stage which can optionally be realized by an operational amplifier 7 with R-C wiring in order to achieve smoothing, then provides the measured value for the reactive current which is generated by a characteristic member 8 coupled to the output of the adding stage 7.

Figure 5:
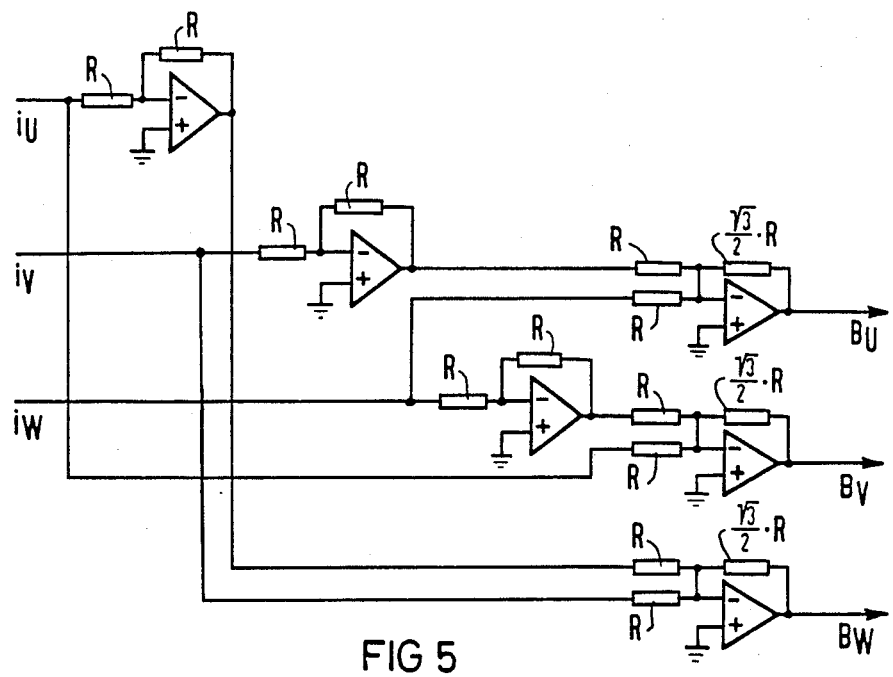
FIG. 5 shows the circuit diagram for a phase shifting network or coordinate rotator used in the circuit of FIG. 4 in connection with the converter of FIG. 1.

FIG. 5 shows an example of a phase shifter in which the original measurement values $i_U$, $i_V$ and $i_W$ can be assembled via corresponding multipliers and adders to form a new system of measurement values shifted by $\pi/2$. This circuit causes practically no phase or amplitude errors.

This determination of active and/or reactive current is, of course, not limited to the three-phase case shown, but can also be used for inverters with other numbers of phases. If the Y-point of the load is not connected, but is free, at least one phase current can be calculated from the other currents, since then the sum of all output currents is zero, whereby the number of components required is reduced, Such a reduction may also be possible in other cases; for instance, due to a strictly symmetrical load, relationships between individual phase currents exist which can be calculated and allow the determination of certain phase currents by computation through the remaining phase currents. Thus, a particularly simple circuit is obtained, for instance, in the three-phase case with a free Y-point, if commercially obtainable integrated circuits are used as analog switches, in which four individual analog switches are combined in a single component. Such a configuration is shown in FIG. 6.

Figure 6:
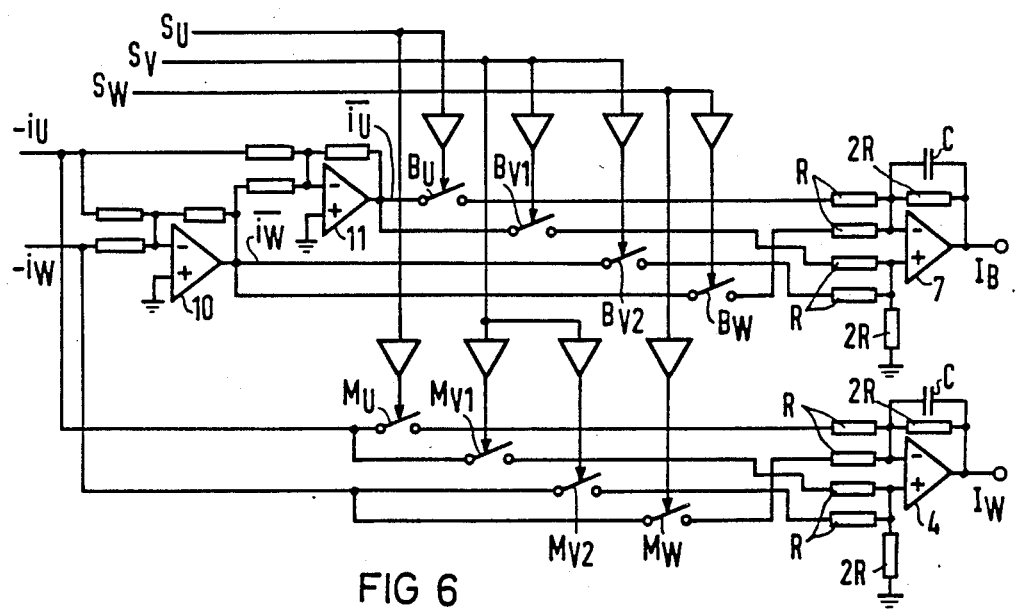
FIG. 6 shows a circuit diagram of apparatus for determining the measurement values for the reactive and the active current.

The amplifier circuits 10 and 11 of FIG. 6 cause, first, the phase shift of 90° required for the determination of the reactive current, where only the inverted measurement values $-i_U$, $-i_W$ are taken as a base. The measurement values $i_U$ and $i_W$, respectively, phase-shifted thereby, are on the one hand, pulse-width-modulated with the switching signals $S_U$ and $S_W$ via the switches $B_U$ and $B_W$ and fed to the inverting input of the operational amplifier 7 (adding stage). On the other hand, these measurement values are pulse-width-modulated also with the switching signal $S_V$ via switches $B_{V1}$ and $B_{V2}$ and fed to the non-inverting input of the adding stage 7, which thus calculates the reactive current $I_B$ at the output according to the condition of the free Y-point ($i_v = i_U - i_W$). The switches $B_U$, $B_W$, $B_{V1}$ and $B_{V2}$ are combined here in a single integrated circuit.

The corresponding arrangement with the switches $M_U$, $M_W$, $M_{V1}$ and $M_{V2}$ is also provided for determining the active current $I_W$, but without the phase shifters 10 and 11.

Overall, a circuit is thus obtained which makes the determination of the reactive current and the active current possible with a minimum amount of technical means.

In the foregoing specification, the invention has been described with reference to specific exemplary embodiments thereof. It will, however, be evident that various modifications and changes may be thereunto without departing from the broader spirit and scope of the invention as set forth in the appended claims. The specification and drawing are, accordingly, to be regarded in an illustrative rather than in a restrictive sense.

What is claimed is:

1. Apparatus for determining the instantaneous power of at least one phase of a load connected inverter having at least one switch coupled to the phase, particularly a pulsed inverter, comprising switch means and means for providing a measurement signal corresponding to the phase current of the inverter to the switch means, the switch means being actuated by a switching signal, which determines the switching state of the at least one switch of the inverter coupled to the phase, a signal corresponding to the instantaneous power of the phase being generated at the output of said switch means.

2. The apparatus recited in claim 1 adapted for determining at least one of the active and reactive power of the phase of the inverter, wherein said switch means comprises first and second switch means, said means for providing a measurement signal comprising means for providing the measurement signal directly to the first switch means for determining the active power and after a phase shift by $\pi/2$ to the second switch means for determining the reactive power, and further comprising first and second smoothing means coupled to respective ones of the first and second switch means for generating output signals corresponding, respectively, to the active power and the reactive power.

3. The apparatus recited in claim 2 further comprising means for weighting said output signals with a quantity proportional to the reciprocal value of a drive signal for the inverter.

4. The apparatus recited in claim 1, wherein the instantaneous power is determined for more than one phase and further comprising adding means for summing the instantaneous powers for each phase.

5. The apparatus recited in claim 4 wherein said inverter has a free Y-point, and said switch means comprises on/off switch means.

6. The apparatus recited in claim 5, wherein at least one of the phase currents is not sensed but is calculated from the measurement signals of the other phase currents.

7. The apparatus recited in claim 4, wherein measurement signals corresponding to respective ones of the phase currents are provided to respective ones of the switch means, the respective phase currents being provided to respective ones of the switch means directly for determining the active power and after a phase shift by $\pi/2$ for determining the reactive power, the output signals of the respective switch means for the active power being added in first adding means and the output signals of the respective switch means for the reactive power being added in second adding means.

8. The apparatus recited in claim 7 further comprising means coupled to each adding means for weighting the signals produced by the addition of the switch output signals with the reciprocal value of the inverter drive, thereby obtaining signals proportional to the active and reactive currents in each phase.

9. The apparatus recited in claim 4, further comprising smoothing means coupled to the output of the switch means.

* * * * *